United States Patent
Yu et al.

(10) Patent No.: US 6,617,224 B2
(45) Date of Patent: Sep. 9, 2003

(54) MULTIPLE STAGE DEPOSITION PROCESS FOR FILLING TRENCHES

(75) Inventors: Hung-Tien Yu, I-Lan (TW); Yiwen Chen, Hsin-Chu (TW)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/895,947

(22) Filed: Jun. 28, 2001

(65) Prior Publication Data

US 2002/0055268 A1 May 9, 2002

(30) Foreign Application Priority Data

Nov. 3, 2000 (TW) ........................................ 89123251 A

(51) Int. Cl.[7] .............................................. H01L 21/76
(52) U.S. Cl. ........................ 438/435; 438/424; 438/763
(58) Field of Search ................................ 438/435, 436, 438/437, 438, 424, 763

(56) References Cited

U.S. PATENT DOCUMENTS

| | | |
|---|---|---|
| 4,732,761 A | 3/1988 | Machida et al. |
| 4,962,063 A | 10/1990 | Maydan et al. |
| 5,089,442 A | 2/1992 | Olmer |
| 5,124,014 A | 6/1992 | Foo et al. |
| 5,204,288 A | 4/1993 | Marks et al. |
| 5,244,841 A | 9/1993 | Marks et al. |
| 5,851,900 A | 12/1998 | Chu et al. |
| 5,981,353 A | 11/1999 | Tsai |
| 5,985,725 A | 11/1999 | Chou |
| 5,994,209 A * | 11/1999 | Yieh et al. ................... 438/541 |
| 6,093,618 A | 7/2000 | Chen et al. |
| 6,174,808 B1 * | 1/2001 | Jang et al. ................... 438/190 |
| 6,180,489 B1 | 1/2001 | Yang et al. |
| 6,184,108 B1 | 2/2001 | Omid-Zohoor et al. |
| 6,187,637 B1 | 2/2001 | Chen et al. |
| 6,204,147 B1 * | 3/2001 | Liu et al. ..................... 438/296 |
| 6,239,002 B1 * | 5/2001 | Jang et al. ................... 438/424 |
| 6,245,691 B1 * | 6/2001 | Jang et al. ................... 438/424 |
| 6,294,483 B1 * | 9/2001 | Wang et al. .................. 438/778 |
| 2002/0076947 A1 * | 6/2002 | Li et al. ....................... 438/788 |

FOREIGN PATENT DOCUMENTS

EP 0520519 12/1992

OTHER PUBLICATIONS

Kuo, Y., "Etch Mechanisim in the Low Refractive Index Silicon Nitride Plasma–enhanced Chemical Vapor Deposition Process," *Applied Physics Letters*, 63(2): 144–146 (1993).

Machida, K., et al., "$SiO_2$ Planarization Technology with biasing and Electron Cyclotron Plasma Deposition for Submicron Interconnections," *J. Vac. Sci. Technol. B*, 4(4): 818–821 91986).

Li, J., et al., "Modeling Studies of the Mechanisms in Biased ECR CVD", 5 pages, No Date.

Lassig, S., et al., "Intermetal Dielectric by Electron Cyclotron Resonance Chemical Vapor Deposition (ECR CVD), No Date" pp. 1–21.

* cited by examiner

*Primary Examiner*—Michael Trinh
(74) *Attorney, Agent, or Firm*—Townsend and Townsend and Crew

(57) ABSTRACT

In a method of filling a trench in a substrate, a substrate is placed in a process zone, the substrate comprising a trench. A first deposition process is performed by providing a first gas into the process zone, maintaining first process conditions to deposit a first silicon oxide material in the trench in the substrate, and exhausting the first gas. Thereafter, a second deposition process is performed by providing a second gas into the process zone, maintaining second process conditions to deposit a second silicon oxide material to fill the trench and optionally overfill the trench, and exhausting the second gas. The multiple process deposition process allows the trench to be filled and overfilled with different types of silicon oxide materials to render the trench filling process more economical.

4 Claims, 3 Drawing Sheets

MULTIPLE STAGE DEPOSITION PROCESS FOR FILLING TRENCHES

BACKGROUND

Embodiments of the present invention relate to the deposition of material in trenches formed in a substrate.

In the processing of integrated circuits and other electronic circuitry on a substrate, materials are deposited or otherwise formed on a substrate by, for example, chemical vapor deposition (CVD), physical vapor deposition (PVD), oxidation, nitridation, and ion implantation. In CVD processes, a deposition gas is used to deposit material on the substrate by heating or in a plasma. In PVD processes, a target is sputtered with an energized gas to deposit material on the substrate. In oxidation and nitridation processes, an oxide or nitride material, such as silicon dioxide or silicon nitride, is formed on the substrate by exposing the substrate to a suitable gaseous environment. In ion implantation, ions are implanted into the substrate. Thereafter, one or more of these materials may be etched to form features, such as trenches, which may be shaped as holes or channels. In the etching process, a pattern of etch-resistant features comprising resist, hard-mask, or both, are formed on the substrate and the exposed portions of the substrate between the etch-resistant features are etched to form the trenches. Thereafter, the trenches may be filled with additional materials for forming other features or layers on the substrate. Planarization processes may also be used to smooth out the surface topography of the substrate in between the deposition of multiple layers.

Figure 3A:
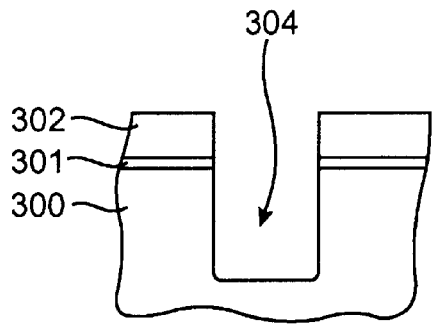
Figure 3B:
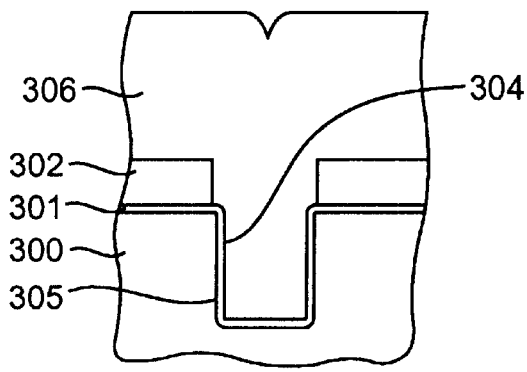
Figure 3C:
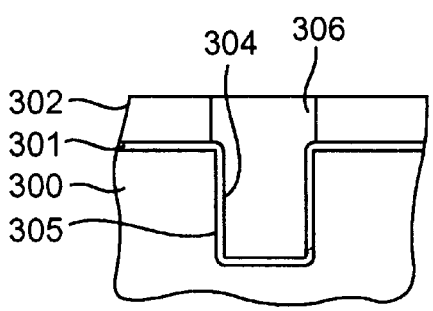

In such substrate processes, it is sometimes desirable to etch a shallow trench, for example, to form a gate, and subsequently, to fill the etched shallow trench with a dielectric material. An embodiment of a conventional deposition process for etching and filling shallow trenches 304 in a substrate 300 is illustrated in FIGS. 3a to 3c. Referring to FIG. 3a, a gate oxide layer 301 (typically silicon dioxide) and a silicon nitride layer 302 is sequentially formed on a substrate 300, such as a silicon wafer. The silicon nitride layer 302, gate oxide layer 301, and substrate 300, are then etched to form the shallow trenches 304. Thereafter, as shown in FIG. 3b, a liner oxide layer 305 is formed in the shallow trenches 304 and the trenches 304 are over-filled with an oxide layer 306 (also typically silicon dioxide). As shown in FIG. 3c, the portions of the oxide layer 306 that lie over the silicon nitride layer 302 may then be removed by chemical-mechanical polishing or etch-back processes.

Figure 1:
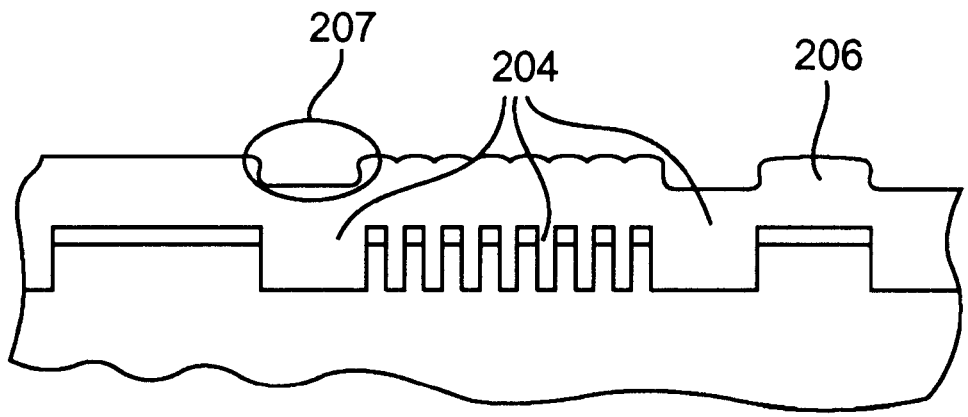
Figure 2:
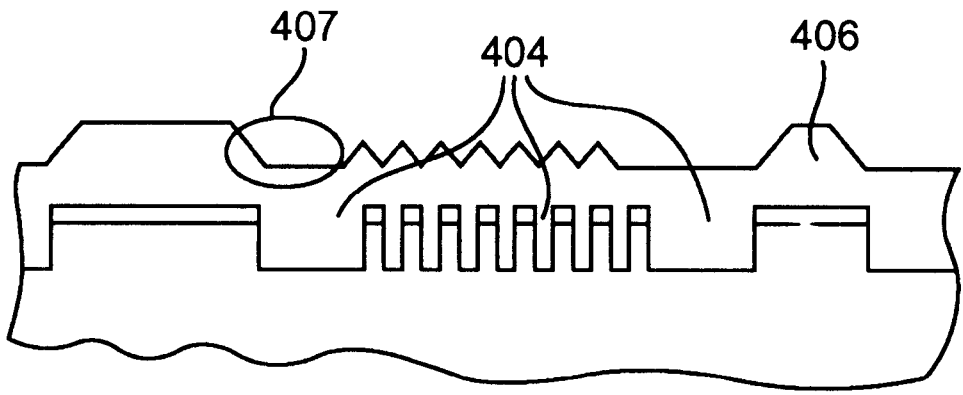

In shallow trench isolation processes, it is often necessary to overfill the trenches to provide a sufficient thickness of oxide material overlying the trenches that subsequent planarization processes can planarize the substrate surface without causing remaining oxide to dish or otherwise form an uneven surface topography. Typically, the oxide material is deposited in the trenches by a sub atmospheric chemical vapor deposition process (SACVD) or by a high density plasma chemical vapor deposition process (HDPCVD). Both these processes result in an uneven surface topography. For example, FIG. 1 shows a typical uneven surface topography of a SACVD derived oxide layer 206 deposited to overfill the trenches 204. FIG. 2 shows a typical uneven surface topography of a HDPCVD oxide layer 406 deposited to overfill the trenches 404. The results of the over-filling processes are represented by reference numbers 207 and 407. Because of such uneven surface topographies, the oxide layers 206 and 406 should be deposited sufficiently thick to prevent the remaining oxide material from dishing or having a non-uniform surface, when the oxide layers 206 and 406 are partially removed in the subsequent planarization process. However, deposition of the relatively thick sacrificial oxide layer undesirably increases the cost of the overall deposition process while reducing process throughput.

Thus, it is desirable to be able to reduce the costs of trench filling processes, especially for filling shallow trenches. It is further desirable to improve the overall speed of the deposition process and increase process throughput. It is also desirable to be able to deposit high quality oxide material in the trenches. It is also desirable to be able to deposit a relatively thick oxide layer on the substrate to reduce formation of dishing or uneven surface topographies in subsequent planarization processes.

SUMMARY

A method of filling a trench in a substrate having a gate oxide layer and an overlying silicon nitride layer, the method comprising, in a first deposition process, exposing the substrate to a first gas maintained at process conditions that cause the first gas to deposit in the trench in the substrate, a first silicon oxide material having a first lower shrinkage; and in a second deposition process, exposing the substrate to a second gas maintained at process conditions that cause the second gas to deposit in the trench, a second silicon oxide material having a second higher shrinkage.

In another aspect, a substrate processing method comprises providing a substrate, forming a gate oxide layer on the substrate, depositing a silicon nitride layer over the gate oxide layer, etching the silicon nitride layer, gate oxide layer, and the substrate, to form the trench in the substrate; in a first deposition process, depositing a first silicon oxide material in the trench in the substrate, the first silicon oxide material having a first shrinkage; and in a second deposition process, depositing a second silicon oxide material in the trench to overfill the trench, the second silicon oxide material having a second shrinkage that higher than the first shrinkage; and planarizing the substrate.

DRAWINGS

Figure 4A:
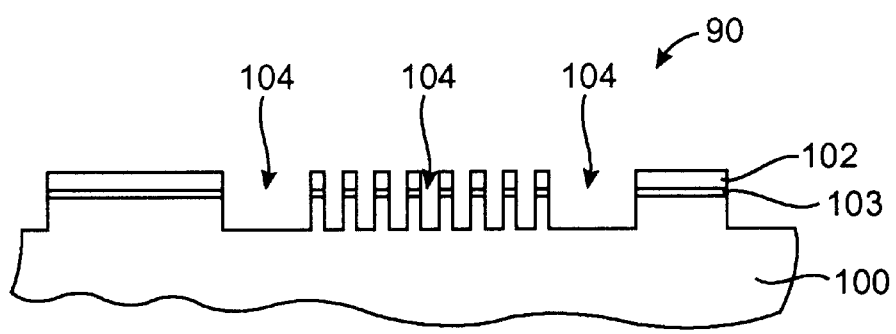
Figure 4B:
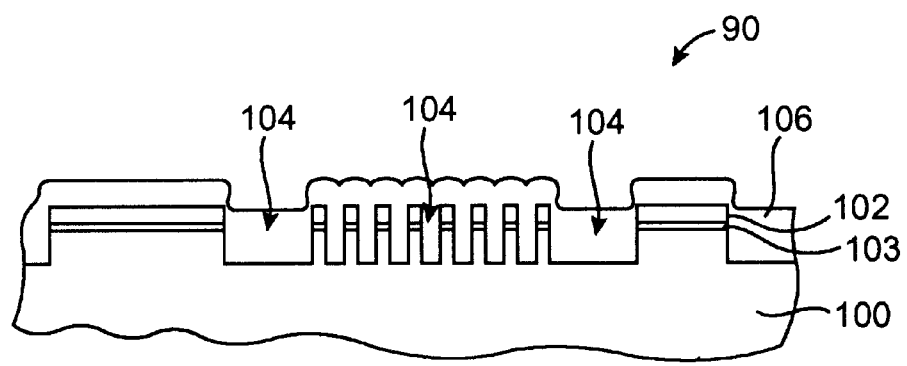
Figure 4C:
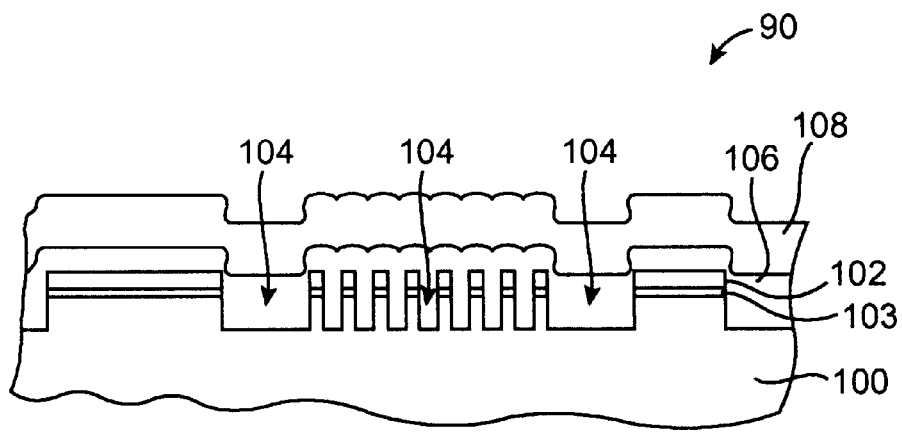

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

FIGS. 1 and 2 are schematic cross-sectional views of substrates having shallow trenches overfilled with oxide material using different processes and the resultant different surface topographies;

FIGS. 3a to 3c are schematic cross-sectional views of a substrate showing an etched trench (FIG. 3a), overfilling of the trench with oxide material (FIG. 3b), and planarization of the overfilled oxide material (FIG. 3c); and FIGS. 4a to 4c are schematic cross-sectional views of a substrate showing an etched trench (FIG. 4a), partial filling of the trench with a first oxide deposition process (FIG. 4b), and over filling of the trench with a second oxide deposition process (FIG. 4c).

DESCRIPTION

A substrate is etched to form a trench that may be shaped as a hole, channel, or other depression, in the substrate. The substrate may be a semiconducting wafer, such as a silicon or gallium arsenide wafer, or may be a dielectric or other material. In one exemplary embodiment, the substrate comprises a silicon wafer with a thin gate oxide layer formed on the substrate, and a thicker silicon nitride layer deposited over the gate oxide layer. The silicon nitride layer, gate oxide layer, and the substrate, are etched to form a trench that extends through both layers and into the silicon wafer. Such trenches are commonly known as shallow trenches, and they often have a depth that is less than or substantially equal to about 4500 angstroms, although they can also have smaller or larger depths.

After etching of the trench, silicon oxide material is deposited to fill the etched trench and to overfill the trench and deposit on the surfaces about the trench. To deposit the silicon oxide material on the substrate, the substrate is placed in a process zone of a process chamber (not shown) having a support to hold the substrate, a gas supply to provide a gas into the chamber, an optional gas energizer to energize the gas when a plasma is desirable, and exhaust system to remove the spent gas. The gas energizer may couple RF or microwave energy to the gas to energize the gas. In one embodiment, the gas energizer comprises an electrode in the chamber that is electrically biased relative to another electrode by a voltage at a bias power level to capacitively couple energy to the gas in the chamber. The gas energizer may also, or alternatively, comprise an inductor coil about a ceiling or sidewall of the chamber to inductively couple energy to the gas in the chamber when a current at a source power level is supplied to the coil.

According to the present process, the trench is filled using multiple deposition processes, which may be performed in a single process chamber or in more than one process chamber. In the first deposition process, a first gas is provided into the process zone and process conditions are set to deposit a first type of silicon oxide material in the trenches in the substrate. The first silicon oxide material is a high quality dielectric material that has a relatively low shrinkage and good dielectric properties to provide good electrical isolation. The shrinkage of a material is a measure of the decrease in volume of the material that occurs after the material has been deposited on the substrate. For example, a suitable dielectric material has a percent shrinkage of less than about 1.3% or the equivalent thereof. However, such materials often deposit at slower deposition rates than dielectric materials having higher shrinkage or otherwise less desirable dielectric properties. Thus, the first deposition process is performed to fill at least a lower portion of the trenches, and optionally, may be continued until the trenches are substantially filled with the high quality dielectric silicon oxide material.

In one embodiment, the first deposition process comprises a high temperature chemical vapor deposition process (HT CVD). In one example, the HT CVD process comprises the steps of providing a first gas comprising tetraethylorthosilane (TEOS), helium, nitrogen, ozone and oxygen, into a process zone containing the substrate, maintaining the first gas at a pressure of from about 400 to about 700 Torr, and maintaining the substrate at a temperature of from about 480 to about 570° C., to fill the trenches in the substrate. The HT CVD process typically deposits high quality oxide material at a relatively slower deposition rate, and consequently, at a higher running or process operating cost. Thus, a portion of the trench, such as a lower portion, may be filled in this step to place the high quality dielectric material where it is most desirable.

In another example, the first deposition process is a high density plasma chemical vapor deposition process (HDPCVD). The HDPCVD process also typically deposits good quality oxide material at relatively slower deposition rates, and consequently, may also have a higher running or process operating cost. A suitable HDPCVD process comprises the steps of providing a first gas comprising silane, oxygen and argon, into a process zone containing the substrate, maintaining the first gas at a pressure of from about 5 to about 20 mTorr, energizing the gas with RF energy at a power level of from about 2000 to about 6000 Watts, and heating the substrate to a temperature of from about 400 to about 600° C., to deposit the HDPCVD material in the trenches.

After the first deposition process is completed, a second deposition process is performed to fill up, and optionally overfill the trench, with a second silicon oxide material having less desirable dielectric properties that is less expensive to operate. The second oxide layer may also be overfilled to form a sacrificial layer on the substrate, which may be subsequently removed by a substrate planarization process. The sacrificial oxide layer is typically deposited at a relatively faster deposition rate. However, because much of the sacrificial oxide layer may be subsequently removed, its properties may not be as good. For example, the second silicon oxide material may have a shrinkage value of at least about 2% or the equivalent thereof. In the second deposition process, a second gas is provided into the process zone, and process conditions are set to deposit a second silicon oxide material in the trench in the substrate from the second gas. The second silicon oxide material may be deposited faster than the first silicon oxide material to lower the operating costs of this stage of the trench filling process. The multiple step deposition process is advantageous, because if the process of forming the second oxide layer, for example, costs one half of, or even one third of, the cost of forming the first oxide layer, the overall deposition process will save over 25% of the cost of a conventional single stage deposition process.

In one example, the second deposition process comprises a plasma enhanced tetraethylorthosilane (PE-TEOS) deposition process, to deposit a second silicon oxide layer derived from tetraethylorthosilane. The PE-TEOS second oxide layer is formed over the first oxide layer because the PE-TEOS oxide layer typically has a lower running or process operating cost than the process operating cost of the first layer. A suitable PE-TEOS deposition process comprises providing a gas comprising TEOS, helium and oxygen into the process zone, maintaining the substrate at a temperature of about 400° C., and maintaining a gas pressure of from about 5 to about 13 Torr. The PE-TEOS process may also be referred to as a PEOx deposition process.

After the multiple deposition processes are completed, a planarization process is performed to planarize the deposited oxide material. The two-stage deposition process provides excess sacrificial oxide material for the planarization process that is typically deposited at a fast rate after the trench is substantially filled with high quality silicon oxide material. A suitable planarization method comprises chemical mechanical planarization in which a polishing slurry is applied to a polishing pad, and the substrate and polishing pad are pressed against one another and rotated at a good speed to polish the surface of the substrate. A suitable slurry may comprise ceramic particles suspended in a liquid suspension medium. When the substrate achieves a desired planarization level, or when a suitable thickness of the dielectric material is removed, the planarization process is stopped.

In the following example, an oxide layer that is at least about 8000 angstroms was used to fill shallow trenches etched about 4500 angstroms deep and having an overlying silicon nitride layer about 1500 angstroms thick. Using the multiple step deposition process, a mixed oxide layer having a total thickness of 8000 angstroms is deposited by (i) a first deposition process to deposit a first oxide layer with a first gas comprising $O_3$ and TEOS, and (ii) a second deposition process to deposit a second oxide layer by a HDPCVD process. The first deposition process is performed until a thickness of about 4000 angstroms of the $O_3$/TEOS based oxide layer is formed, which is a high quality oxide layer having a shrinkage of less than about 1.3%, and thereafter, a lower quality oxide layer having a shrinkage of at least about 2%, is formed on the $O_3$/TEOS layer. Thereafter, the 8000 angstrom thick mixed multiple oxide layer deposited over the surface silicon nitride pad layer is planarized by chemical-mechanical polishing until the underlying silicon nitride pad layer is exposed and the oxide layer covering the silicon nitride pad is substantially removed.

FIGS. 4a–4c are schematic cross-sectional views of a shallow trench isolation process according to an embodiment of this invention. As shown in FIG. 4a, trenches 104 are formed in a substrate 90 comprising a silicon wafer 100 having a thin oxide layer 103 and an overlying silicon nitride layer 102. The trenches 104 may be formed by, for example, sequentially forming the thin oxide layer 103 and silicon nitride layer 102 on the silicon wafer 100, and then etching the silicon nitride layer 102, thin oxide layer 103, and the silicon wafer 100, to a depth of about 4500 angstroms. In this example, the thin oxide layer 103 has a thickness of less than about 50 angstroms and the silicon nitride layer 102 has a thickness of about 1500 angstroms.

Referring to FIG. 4b, a first oxide layer 106 is then deposited on the substrate 90 until the trenches 104 are substantially filled. The first oxide layer 106 may be deposited to fill the trenches 104, for example, to a thickness a little less than an average depth of the trenches 104. In one example, the first oxide layer 106 has a thickness of about 4000 angstroms. The first oxide layer 106 can be, for example, deposited by a high temperature sub-atmospheric chemical vapor deposition process (HT CVD) or a high density plasma chemical vapor deposition (HDPCVD) process, as previously described.

Referring to FIG. 4C, a second oxide layer 108 is formed on the first oxide layer 106 over the substrate 90. The second oxide layer 108 may be formed by a process having a lower operating or running cost than the process used to form the first oxide layer 106, as describe above. For example, the second oxide layer 108 may be deposited by a process plasma-enhanced oxide (PE-ox) deposition process, such as a plasma-enhanced tetraethyl orthosilicate (PE-TEOS) process. Thereafter, a planarization process, such as chemical-mechanical polishing or etching back process, is performed to remove excess oxide deposits.

Examples 1 and 2 are examples of process parameters which may be used to deposit the first and second oxide materials. In these examples, the gas pressure is in Torrs or millitorrs (mTorrs), temperature in Celsius degrees (C), helium gas pressure in pounds per square inch (psi), RF bias power in watts (W), and gas flow rates in standard cubic centimeters per seconds (sccm) or mgm.

EXAMPLE 1

In example 1, a shallow trench on a silicon substrate having a gate oxide layer and an overlying silicon nitride layer, was first partially filled by a HT CVD deposition process having the following parameters:
   Gas composition: TEOS at 1500–6000 mgm, He at 3500–7000 sccm, $N_2$ at 3500–7000 sccm, $O_3$ at 5000–6000 sccm, and $O_2$ at 1000–3000 sccm;
   Gas pressure: 400–700 Torr;
   Temperature: 400–570° C.;
   Helium gas pressure: 30–40 psi;
   RF bias power: 0 W; and
   Source power: 0 W.

Thereafter, the shallow trench was overfilled by depositing a second oxide layer by a PE-TEOS deposition process having the following parameters:
   Gas composition: TEOS at 800–4000 mgm, He at 1000–4000 sccm, and $O_2$ at 600–4000 sccm;
   Gas pressure: 5–13 Torr;
   Temperature: 400° C.;
   Helium gas pressure: 30–40 psi;
   RF bias power: 0 W; and
   Source power: 1000+/−300 W.

EXAMPLE 2

In Example 2, a shallow trench on a silicon substrate having a gate oxide layer and a silicon nitride layer, was first partially filled by a HDPCVD deposition process having the following parameters:
   Gas composition: Silane at 30–200 sccm, $O_2$ at 60–400 sccm, and Ar at 0–200 sccm;
   Pressure: 5–20 mTorr;
   Temperature: 400–600° C.;
   Helium gas pressure: 30–40 psi;
   RF bias power: 2000–6000 W; and
   Source power: 2000–6000 W.

Thereafter, the shallow trench was overfilled by depositing a second oxide layer by a PE-TEOS deposition process having the following parameters:
   Gas composition: TEOS at 800–4000 mgm, He at 1000–4000 sccm, and $O_2$ at 600–4000 sccm;
   Pressure: 5–13 Torr;
   Temperature: 400° C.;
   Helium gas pressure: 30–40 psi;
   RF bias power: 0 W; and
   Source power: 1000+/−300 W.

The present invention is described with reference to certain preferred versions thereof, however, other versions are possible. For example, other types of deposition processes may be used to deposit multiple layers of oxide material in the trenches in the substrate, as would be apparent to one of ordinary skill. Also, the trenches and the layers on the substrates, may be of other types of dielectric materials, such as low k dielectric materials, as would be apparent to one of ordinary skill. Therefore, the spirit and scope of the appended claims should not be limited to the description of the preferred versions contained

What is claimed is:

1. A method of filing a trench in a substrate having a gate oxide layer and an overlying silicon nitride layer the method comprising:
   (a) in a first deposition process, exposing the substrate to a first gas maintained at process conditions that cause the first gas to deposit in the trench in the substrate, a first silicon oxide material having a first lower shrinkage less than about 1.3%; and (b) in a second deposition process, exposing the substrate to a second gas maintained at process conditions that cause the second gas to deposit in the trench, a second silicon oxide material having a second higher shrinkage.

2. A method according to claim 1 wherein the second shrinkage is at least about 2%.

3. A substrate processing method comprising:

(a) providing a substrate having a gate oxide layer and a silicon nitride layer over the gate oxide layer;

(b) etching the silicon nitride layer, gate oxide layer, and substrate, to form trenches in the substrate;

(c) in a first deposition process, depositing a first silicon oxide material in the trenches in the substrate, the first silicon oxide material having a first shrinkage less than about 1.3%;

(d) in a second deposition process, depositing a second silicon oxide material in the trenches until the trenches are overfilled, the second silicon oxide material having a second shrinkage that is higher than the first shrinkage; and (e) planarizing the substrate.

4. A substrate processing method comprising:

(a) providing a substrate having a gate oxide layer and a silicon nitride layer over the gate oxide layer;

(b) etching the silicon nitride layer, gate oxide layer, and substrate, to form trenches in the substrate;

(c) in a first deposition process, depositing a first silicon oxide material in the trenches in the substrate, the first silicon oxide material having a first shrinkage less than about 1.3%;

(d) in a second deposition process, depositing a second silicon oxide material in the trenches until the trenches are overfilled, the second silicon oxide material having a second shrinkage of at least about 2% that is higher than the first shrinkage; and (e) planarizing the substrate.

* * * * *